(12) United States Patent
Mastromatteo et al.

(10) Patent No.: US 6,504,253 B2
(45) Date of Patent: Jan. 7, 2003

(54) STRUCTURE FOR ELECTRICALLY CONNECTING A FIRST BODY OF SEMICONDUCTOR MATERIAL OVERLAID BY A SECOND BODY OF SEMICONDUCTOR MATERIAL COMPOSITE STRUCTURE USING ELECTRIC CONNECTION STRUCTURE

(75) Inventors: Ubaldo Mastromatteo, Bareggio (IT); Fabrizio Ghironi, Bareggio (IT); Roberto Aina, Bareggio (IT); Mauro Bombonati, Abbiategrasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/844,180

(22) Filed: Apr. 27, 2001

(65) Prior Publication Data

US 2001/0038148 A1 Nov. 8, 2001

(30) Foreign Application Priority Data

Apr. 28, 2000 (EP) .............................. 00830314

(51) Int. Cl.[7] .......................... H01L 23/48; H01L 23/52; H01L 29/40
(52) U.S. Cl. ..................... 257/758; 257/723; 257/686; 257/688; 438/622; 438/118; 438/107
(58) Field of Search ............................... 257/723, 686, 257/777, 698, 774, 688, 680, 678, 758; 438/106, 108, 109, 110, 107, 118, 622

(56) References Cited

U.S. PATENT DOCUMENTS

| | | | |
|---|---|---|---|
| 4,239,312 A | 12/1980 | Myer et al. | 339/17 N |
| 4,660,066 A | 4/1987 | Reid | 357/30 |
| 4,807,021 A * | 2/1989 | Okumura | 257/75 |
| 4,939,568 A | 7/1990 | Kato et al. | 357/75 |
| 5,270,261 A * | 12/1993 | Bertin et al. | 438/209 |
| 5,640,049 A * | 6/1997 | Rostoker et al. | 257/758 |
| 5,756,395 A | 5/1998 | Rostoker et al. | 438/622 |
| 6,087,719 A * | 7/2000 | Tsunashima | 257/723 |
| 6,362,518 B1 * | 3/2002 | Yatsuda | 257/678 |

FOREIGN PATENT DOCUMENTS

EP          0 317 084 A2    5/1989

OTHER PUBLICATIONS

Schmidt, M., "Wafer-to-Wafer Bonding for Microstructure Formation," *Proceedings of the IEEE*, 86(8):1575–1585, Aug. 1998.

* cited by examiner

*Primary Examiner*—David Nelms
*Assistant Examiner*—Andy Huynh
(74) *Attorney, Agent, or Firm*—Lisa K. Jorgenson; Robert Iannucci; Seed IP Law Group PLLC

(57) ABSTRACT

An electric connection structure connecting a first silicon body to conductive regions provided on the surface of a second silicon body arranged on the first body. The electric connection structure includes at least one plug region of silicon, which extends through the second body; at least one insulation region laterally surrounding the plug region; and at least one conductive electromechanical connection region arranged between the first body and the second body, and in electrical contact with the plug region and with conductive regions of the first body. To form the plug region, trenches are dug in a first wafer and are filled, at least partially, with insulating material. The plug region is fixed to a metal region provided on a second wafer, by performing a low-temperature heat treatment which causes a chemical reaction between the metal and the silicon. The first wafer is thinned until the trenches and electrical connections are formed on the free face of the first wafer.

26 Claims, 6 Drawing Sheets

US 6,504,253 B2

STRUCTURE FOR ELECTRICALLY CONNECTING A FIRST BODY OF SEMICONDUCTOR MATERIAL OVERLAID BY A SECOND BODY OF SEMICONDUCTOR MATERIAL COMPOSITE STRUCTURE USING ELECTRIC CONNECTION STRUCTURE

TECHNICAL FIELD

The present invention regards a structure for electrically connecting a first body of semiconductor material overlaid by a second body of semiconductor material, a composite structure using the electric connection structure and a manufacturing process.

BACKGROUND OF THE INVENTION

In particular, the invention can be used for electrically connecting a first silicon wafer incorporating electronic components to a second silicon wafer incorporating a micro-mechanical structure and/or to the outside. The invention can likewise be used for electrically connecting the first wafer to a third body carried by the second wafer, as well as for connecting the first wafer to the outside when the first wafer is covered by a protection structure, and thus is not directly accessible. An example of a particular application is represented by a micro-electromechanical system including a first wafer incorporating a circuit for controlling the parameters defining the state of a micro-electromechanical structure (for example, the position of a microactuator); a second wafer incorporating the micro-electromechanical structure; and a third wafer forming a cap for protecting the micro-electromechanical structure.

Various techniques are known for mechanically connecting two semiconductor material bodies (see, for example, Martin A. Schmidt, "Wafer-to-Wafer Bonding for Microstructure Formation", Proceedings of the IEEE, Vol. 86, No. 8, August 1998). However, such techniques do not enable two or three wafers to be electrically connected, in addition to be mechanically connected, or covered components of one of the wafers to be electrically accessed.

SUMMARY OF THE INVENTION

An embodiment of the present invention provides a connection structure that enables semiconductor material bodies made on different substrates to be overlaid and to be connected mechanically and electrically together and to the outside.

According to embodiments of the present invention, an electric connection structure, a composite structure, and a process for manufacturing a composite structure are provided. The electric connection structure connects a first silicon body to conductive regions provided on the surface of a second silicon body arranged on the first body. The electric connection structure includes at least one plug region of silicon, which extends through the second body; at least one insulation region laterally surrounding the plug region; and at least one conductive electromechanical connection region arranged between the first body and the second body, and in electrical contact with the plug region and with conductive regions of the first body. To form the plug region, trenches are dug in a first wafer and are filled, at least partially, with insulating material. The plug region is fixed to a metal region provided on a second wafer, by performing a low-temperature heat treatment which causes a chemical reaction between the metal and the silicon. The first wafer is thinned until the trenches and electrical connections are formed on the free face of the first wafer.

BRIEF DESCRIPTION OF THE DRAWINGS

For a better understanding of the present invention, preferred embodiments thereof are now described, merely to provide non-limiting examples, with reference to the attached drawings, wherein.

DETAILED DESCRIPTION OF THE INVENTION

FIGS. 1–8 show a first embodiment of a process for manufacturing a micro-electromechanical system, including a control and sensing circuitry and a micro-electromechanical sensor, for example an acceleration sensor.

Figure 1:
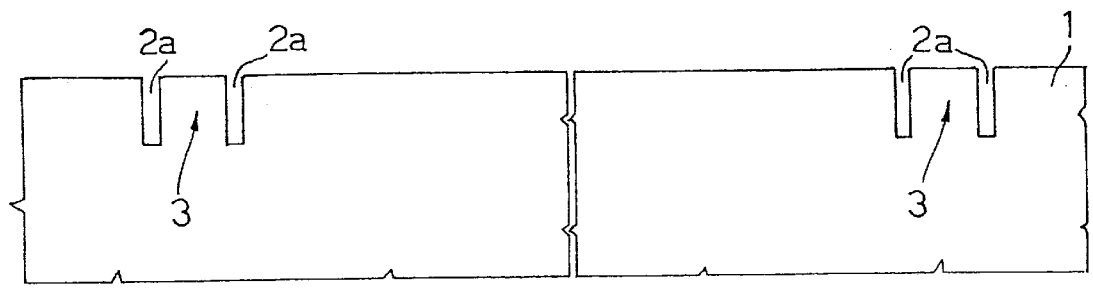
FIGS. 1 and 2 are cross-sections through a semiconductor material wafer, in two successive manufacture steps, according to a first embodiment of the invention.
Figure 2:
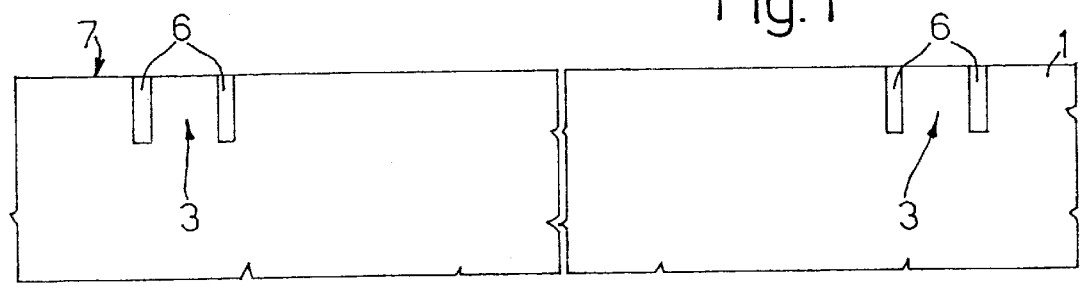

Initially, as illustrated in FIG. 1, a first wafer 1 of semiconductor material, typically $P^{++}$ or $N^{++}$ doped monocrystalline silicon, illustrated as sectioned along two parallel half-planes so as to show different areas in the left-hand half and in the right-hand half, is masked and etched to form first deep trenches 2a. For example, the first wafer 1 may have a conductivity of between 5 and 15 mΩ/cm, preferably 10 mΩ/cm. As shown in FIG. 2, the first trenches 2a have a closed shape and enclose monocrystalline silicon plug regions 3 intended to form through connections, as explained more clearly hereinafter.

Subsequently, the first trenches 2a are filled, either completely or partially, with insulating material 6, for example silicon dioxide. To this end, a silicon dioxide layer is deposited or grown, and is subsequently removed from a first surface 7 of the first wafer 1, to obtain the structure shown in FIG. 2.

Figure 3:
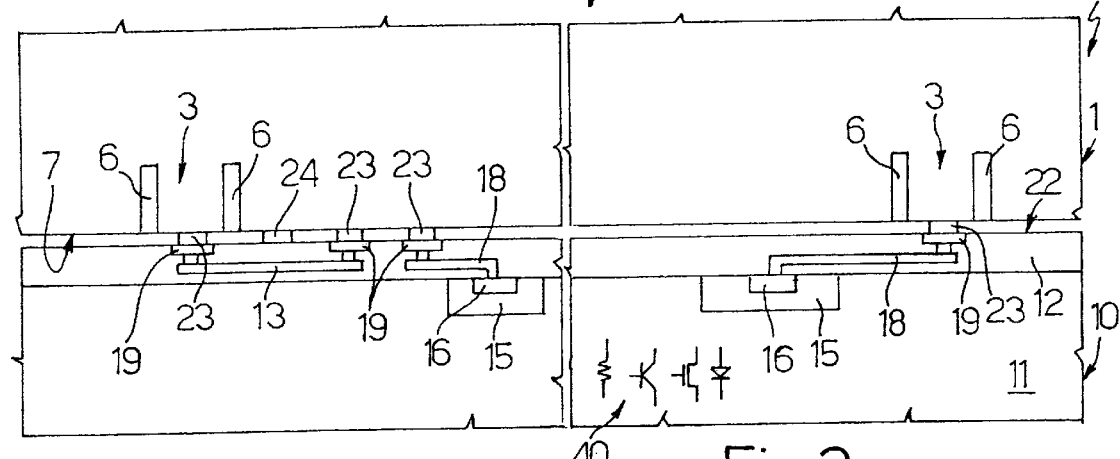
FIG. 3 shows a cross-section through the wafer of FIG. 2, after bonding to a second semiconductor material wafer.

Next, as illustrated in FIG. 3, the first wafer 1 is bonded to a second wafer 10 formed of a monocrystalline silicon substrate 11 and an insulation and/or passivation layer 12. In particular, the substrate 11 houses conductive and/or insulating regions forming electronic components for biasing the acceleration sensor 8 and for detecting and processing electrical signals generated by the acceleration sensor 8. As an example, FIG. 3 shows conductive regions 15–16 of the N/P-type belonging to an electronic circuit 40, which is shown only schematically. In addition, the insulation and/or passivation layer 12 houses metal regions 13, 18, which terminate, at one or both of their ends, with pad regions 19 facing the surface 22 of the second wafer 10.

Connection regions 23 are provided on the surface 22 of the second wafer 10, on top of the pad regions 19, and are of a metal that is able to react at a low temperature with the silicon of the first wafer 1 to form a gold/silicon eutectic or a metallic silicide. Typically, the connection regions 23 are made of gold, in the case where the aim is to obtain a eutectic, or of a metal chosen from among the group comprising palladium, titanium, and nickel, in the case where the aim is to obtain a silicide. Bonding regions 24 are also provided on the surface 22 and are preferably formed at the same time as the connection regions 23.

For bonding the first wafer 1 to the second wafer 10, the first wafer 1 is turned upside down so that the first surface 7 of the first wafer 1 faces the second wafer 10. The plug regions 3 of the first wafer 1 are brought into contact with the connection regions 23 of the second wafer 10, and subsequently a heat treatment at low temperature, for example 350–450° C., is carried out for a period of 30–45 minutes, so that the metal of the connection regions 23 of the second wafer 10 react with the silicon of the plug regions 3 and form a metallic silicide which bonds the first and the second wafers 1, 10. Thereby, a double wafer 25 is obtained, as shown in FIG. 3.

Figure 4:
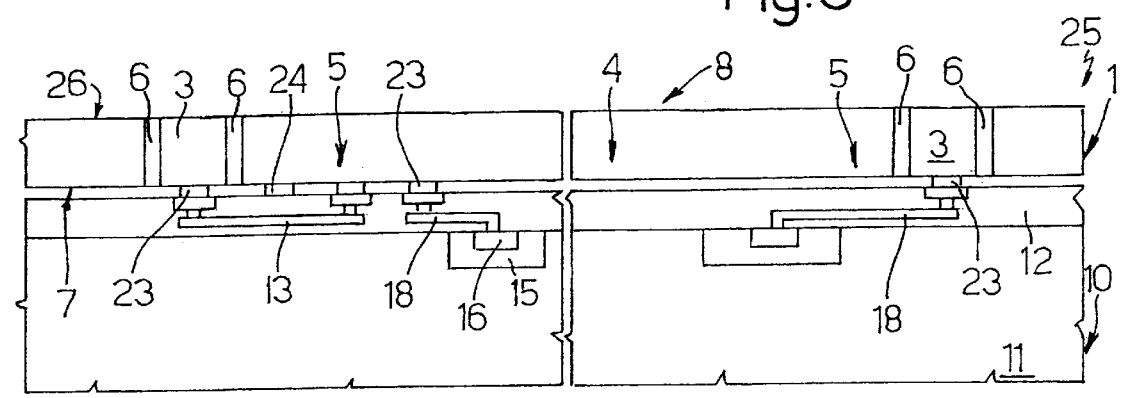
FIGS. 4–6 show cross-sections of the multiwafer structure of FIG. 3, in successive manufacture steps.

Subsequently, as illustrated in FIG. 4, the first wafer 1 is thinned from the back mechanically, for example by grinding, preferably so as to obtain a thickness of 30–40 μm. The first wafer 1 then has a second surface 26 opposite to the first surface 7.

Figure 5:
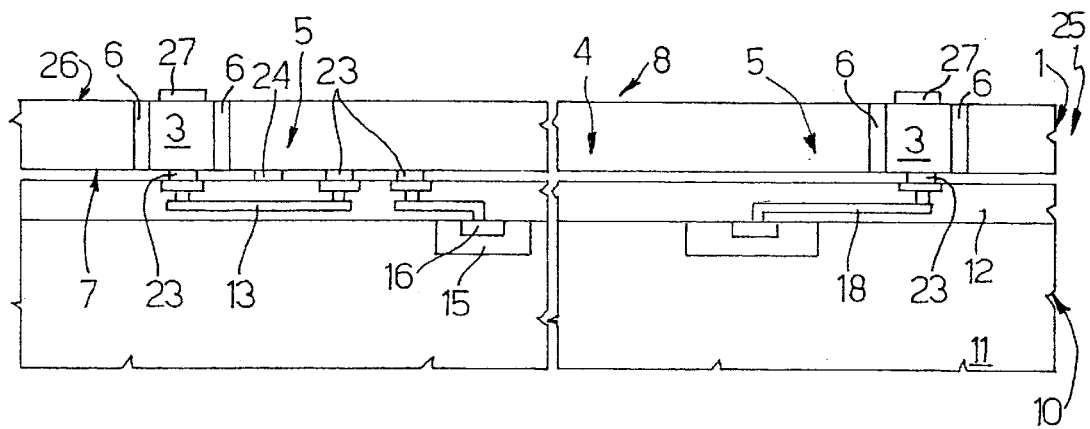
Figure 6:
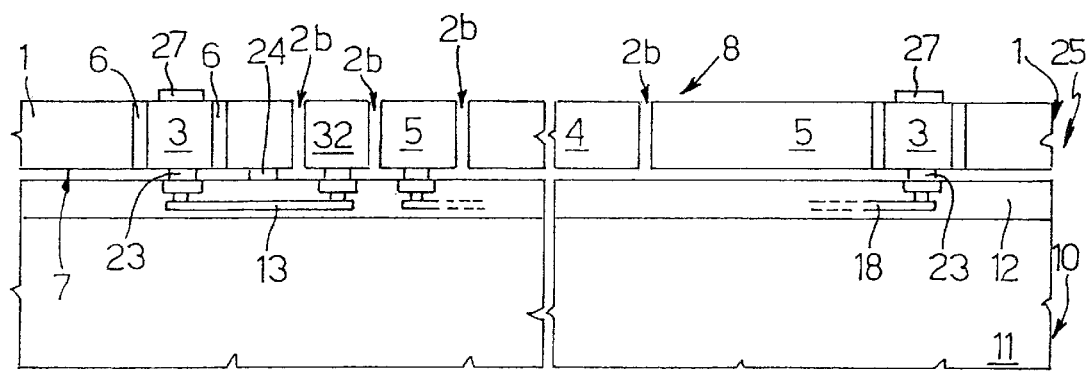

Next, as illustrated in FIG. 5, a metal layer, for example, an aluminum layer, is deposited and defined, so as to form metal regions 27 extending above the plug regions 3 and in direct electrical contact with the latter.

Subsequently, the first wafer 1 is masked and etched so as to form second trenches 2b defining an acceleration sensor 8. In particular, as may be seen in FIGS. 6 and 7, the second trenches 2b separate a mobile region, forming a rotor 4, and a fixed region, forming a stator 5, from the rest of the wafer 1 and from one another. The rotor 4 is connected, through elastic-connection regions, also referred to as springs 31, to fixed biasing regions 32, which are set in areas corresponding to respective connection regions 23, connected, through the metallic regions 13, to the plug regions 3.

Figure 8:
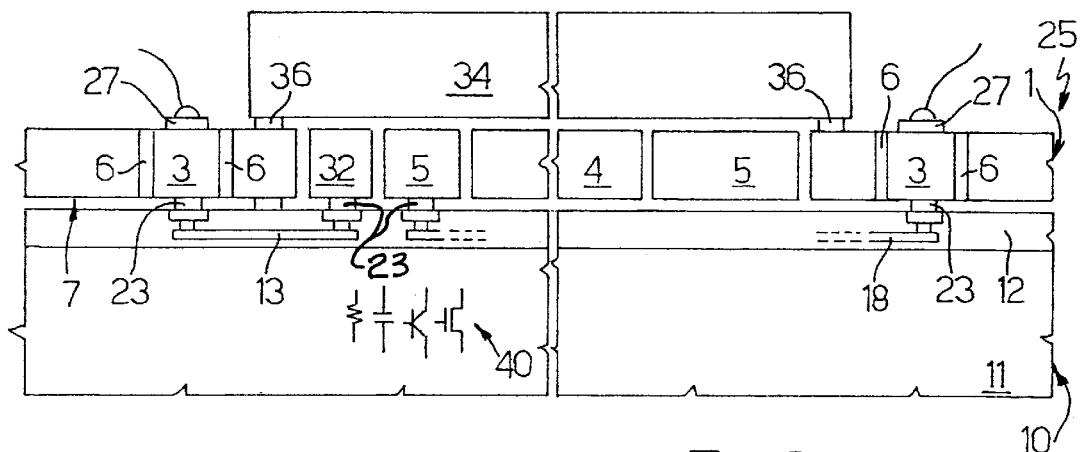
FIG. 8 shows a cross-section of the multiwafer structure of FIG. 6, in a final manufacture step.

Next, as illustrated in FIG. 8, a cap element 34 is fixed to the wafer 1 through adhesive regions 36, in a per se known manner, and then the double wafer 25 is cut into individual dice. Finally, the metal region 27 is contacted applying the usual wire-bonding technique.

Thereby, the connection regions 23 ensure mechanical connection between the monocrystalline silicon wafers 1 and 10 and electrical connection between the surface 22 of the second wafer 10 and the plug regions 3. In turn, the plug regions 3 allow the second wafer 10 to be contacted from above. In particular, some plug regions 3 enable the second wafer 10, not directly accessible from the front, to be connected to the outside, without requiring costly processes to be carried out from the back. In addition, as is shown in the left-hand half of FIG. 8, this solution also enables connection of regions formed in the first wafer 1 to the outside. Here the rotor 4 is connected to the outside through a first connection region 23 (beneath the biasing region 32), a metal region 13, a second connection region 23 (beneath the plug region 3), and the plug region 3. The plug regions 3 are insulated by insulation regions formed by the insulating material 6 and possibly by the air present in the first deep trenches 2a, and are thus electrically insulated from the rest of the first wafer 1, except, obviously, for the regions connected to them via electric connection lines 30, shown in FIG. 10.

With the solution of FIGS. 1–8 a pressure sensor, instead of an acceleration sensor, may be formed.

Figure 9:
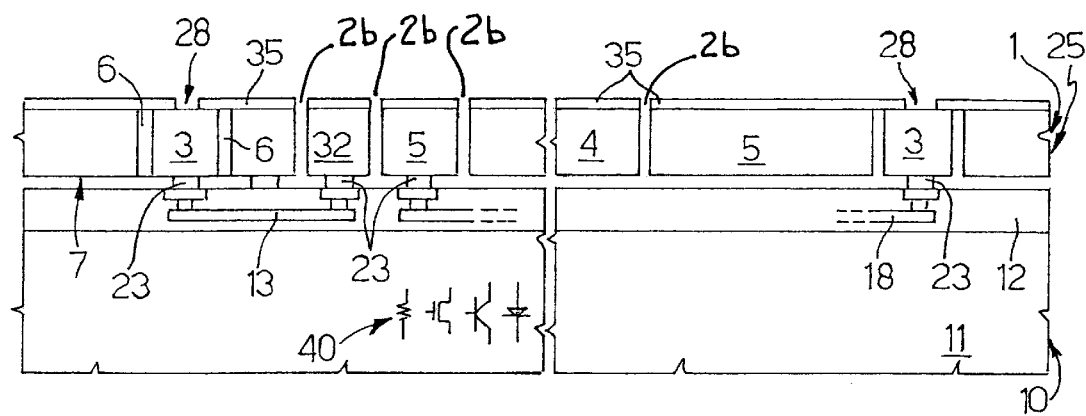
FIGS. 9–11 show cross-sections of a micro-electromechanical system according to a second embodiment of the invention.
Figure 10:
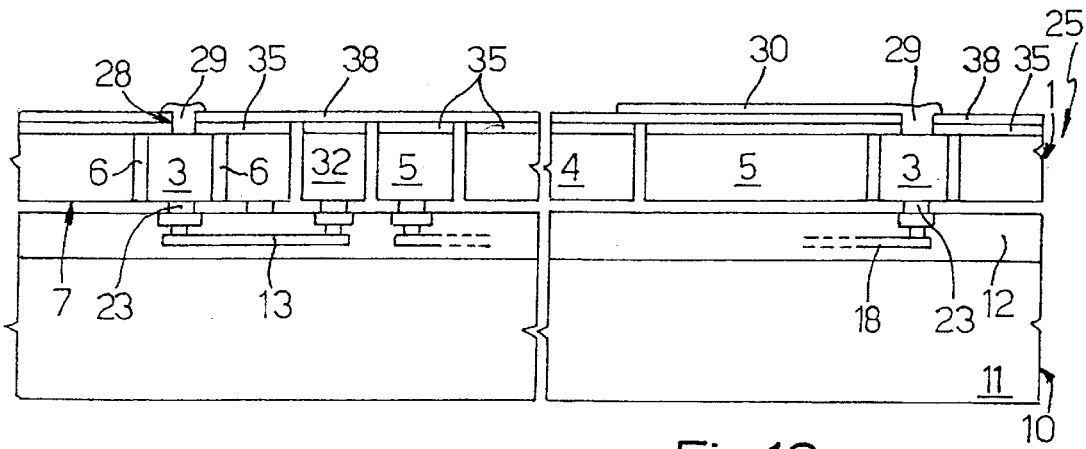
Figure 11:
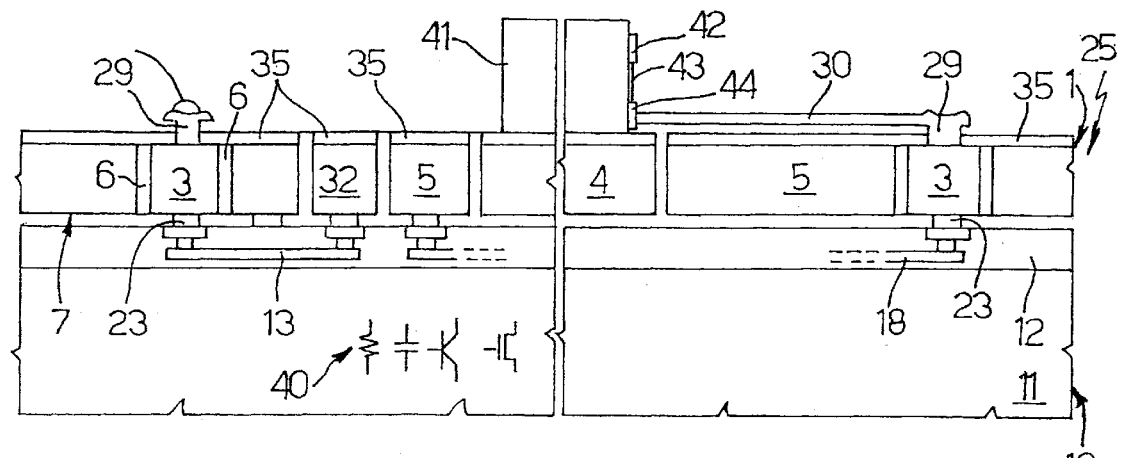

FIGS. 9–11 show a second embodiment of the invention regarding a unit for micrometric regulation of the read/write head of a hard-disk driver. In detail, initially the same steps are carried out as described previously with reference to FIGS. 1–4. After thinning the first wafer 1, an oxide layer 35 is deposited and removed selectively at the plug regions 3 to form openings 28. The second trenches 2b are then formed through the oxide layer 35 and through the wafer 1.

Subsequently, as illustrated in FIG. 10, an insulating layer 38 is deposited, for example a stick foil which does not enter the second trenches 2b. The insulating layer is removed from above the openings 28, and metal connection regions are formed by depositing and defining a metal layer. In particular, in the illustrated example the metal layer fills the openings 28, where it forms contacts 29. In addition, an electric connection line 30 is formed and extends from the contact 29 arranged above the plug region 3 furthest to the right, up to above the rotor 4.

Subsequently, the composite wafer 25 is cut into dice, the insulating layer 38 is removed in oxygen plasma, and a ceramic body, referred to as slider 41, is bonded to the rotor 4 in a per se known manner (FIG. 11). The slider 41 carries a transducer 42 for data reading/writing on a hard disk (not shown). The transducer 42 is electrically contacted through connection regions 43, one of which may be seen in FIG. 11, which are formed directly on one side of the slider 41. Each connection region 43 extends from the transducer 42 as far as a pad 44 in electrical contact with an electric connection line 30.

Thereby, the plug region 3 furthest to the right enables electrical connection between the transducer 42 on the slider 41 and the electrical circuit 40, which can thus transmit to the transducer 42 the data to be written, or process the signal picked up by the transducer 42. In addition, in a known manner, the electrical circuit 40 controls movement of the rotor 4, and consequently of the slider 41. Finally, a connection via an intermediate plug region (not shown) enables connection of the electrical circuit 40 to the outside, in a way similar to that illustrated in the right-hand part of FIG. 8.

Consequently, also in this case the plug regions 3 enable connection of non-accessible regions of the second wafer 10 to elements arranged above them (here, the transducer 42), as well as to the outside.

Figure 12:
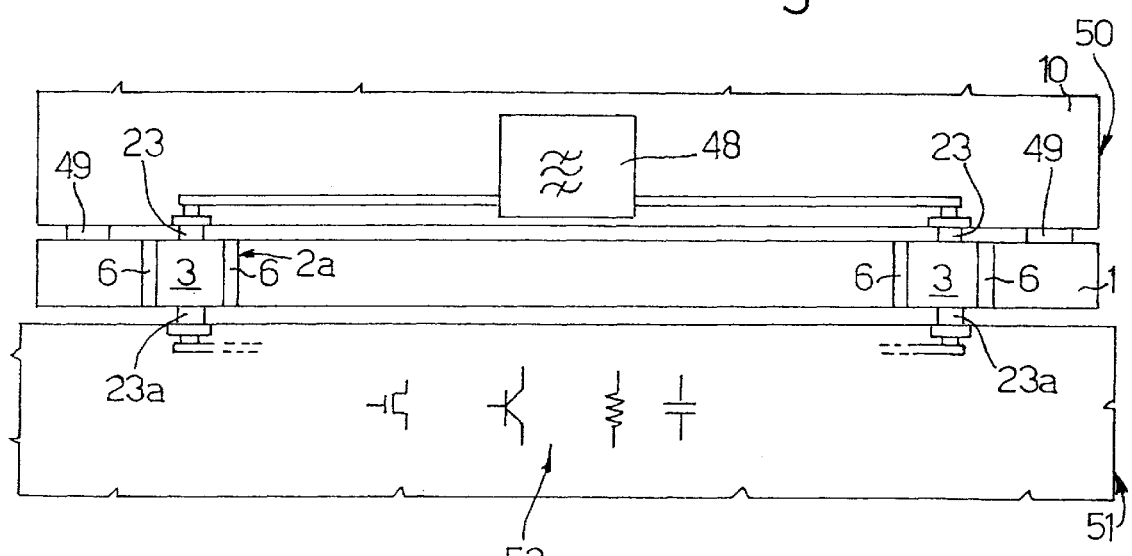
FIG. 12 shows a cross-section of a composite structure formed starting from three semiconductor material substrates, according to a third embodiment of the invention.
Figure 13:
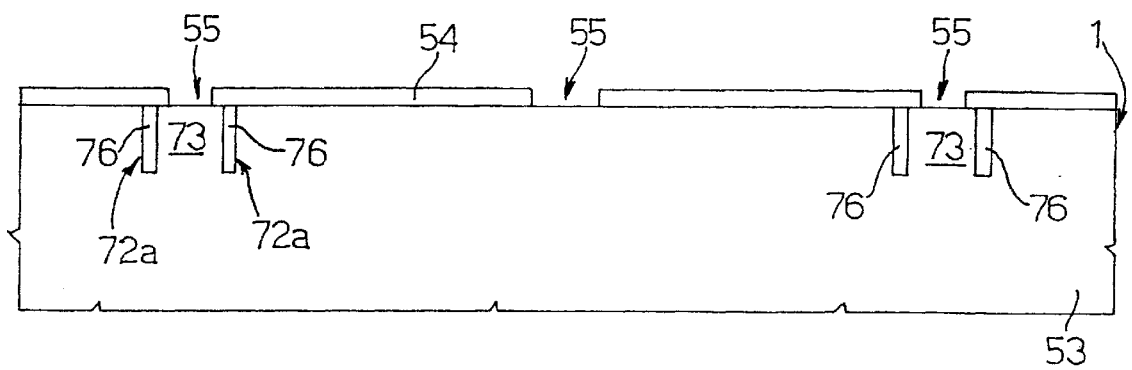
FIGS. 13 and 14 show cross-sections of a semiconductor material wafer, in two successive manufacture steps according to a fourth embodiment of the invention.
Figure 14:
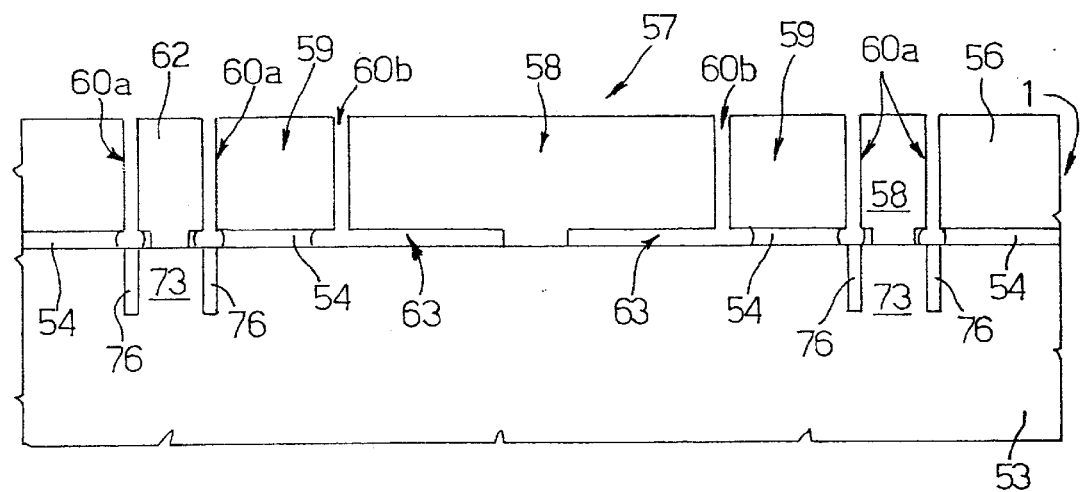

FIG. 12 shows a third embodiment regarding the manufacture of circuits or structures to be kept in vacuum conditions. In the illustrated example, the wafer 1, after forming the plug regions 3 by digging the first trenches 2a and filling them with insulating material 6, has been bonded to a second wafer 10, wherein a filter 48 has been previously made, for example of the band-pass type for high frequencies. The first wafer 1 is bonded to the second wafer 10, not only through the connection regions 23, but also through a sealing region 49 which extends between the first wafer 1 and the second wafer 10, and completely surrounds the area in which the filter 48 is formed, as well as the plug regions 3. The sealing region 49 is, for example, made using a low-melting temperature glass and has a closed shape. If bonding of the first wafer 1 and second wafer 10 is carried out in a low-pressure environment, the filter 48 remains vacuum encapsulated.

Next, the first wafer 1 is thinned as described above, and the double wafer 1, 10 is cut into dice 50. The dice 50 are then bonded to a third wafer 51 which houses a circuit 52 and which has previously been provided with connection regions 23a similar to the connection regions 23. The thinned side of the first wafer 1 faces the third wafer 51, and the plug regions 3 must be aligned to the connection regions 23a.

In this case, the first wafer 1, in addition to protecting and isolating the filter 48 from the outside environment and maintaining it in vacuum conditions, enables its electrical connection with the circuit 52 incorporated in the third wafer 51. In addition, it is possible to carry out electrical testing of the circuit 52 connected to the filter 48 at the wafer level (EWS-Electric Wafer Sort test).

FIGS. 13–16 show a fourth embodiment of the invention. According to FIG. 13, initially the first wafer 1 comprises a substrate 53 accommodating first trenches 72a, and the first trenches 72a are filled with insulating material 76 to insulate first plug portions 73, in a way similar to that described with reference to FIG. 1 for the plug regions 3. Then a sacrificial layer 54, for example of silicon dioxide, is deposited or grown, then is masked and etched so as to form openings 55 on top of the first plug portions 73 and in areas where anchorages with the structure on top are to be made, as described hereinafter.

Subsequently (FIG. 14), a polycrystalline silicon seed layer is deposited on top of the sacrificial layer 54 and in the openings 55, and then a polycrystalline silicon epitaxial layer 56 is grown. In this way, the epitaxial layer 56 is in direct contact with the substrate 53 at the openings 55. Next, inside the epitaxial layer 56 third and fourth trenches 60a, 60b are dug, which reach as far as the sacrificial layer 54. In particular, the third trenches 60a delimit second plug portions 62 aligned vertically with the first plug portions 73 in the substrate 53, and the third trenches 60a define a desired micromechanical structure (in the example illustrated, a microactuator 57 of the rotating type, including a rotor 58 and a stator 59, with the rotor 58 supported by springs, which are not illustrated).

Subsequently, in a known way, a part of the sacrificial layer 54 is removed through the fourth trenches 60b. In particular, the sacrificial layer 54 is removed beneath the rotor 58 to form an air gap 63, and it substantially remains underneath the stator 59. The sacrificial layer 54 is removed only to a very small extent through the third trenches 60a, given the different geometry (the micromechanical structure is formed by thin regions and/or perforated regions, allowing the sacrificial layer 54 to be substantially removed; this, instead, is not done through the third trenches 60a).

In a way not shown, it is then possible to fill the third trenches, at least partially, with insulating material, in a way similar to that described for the first trenches 2a of FIG. 1.

Figure 15:
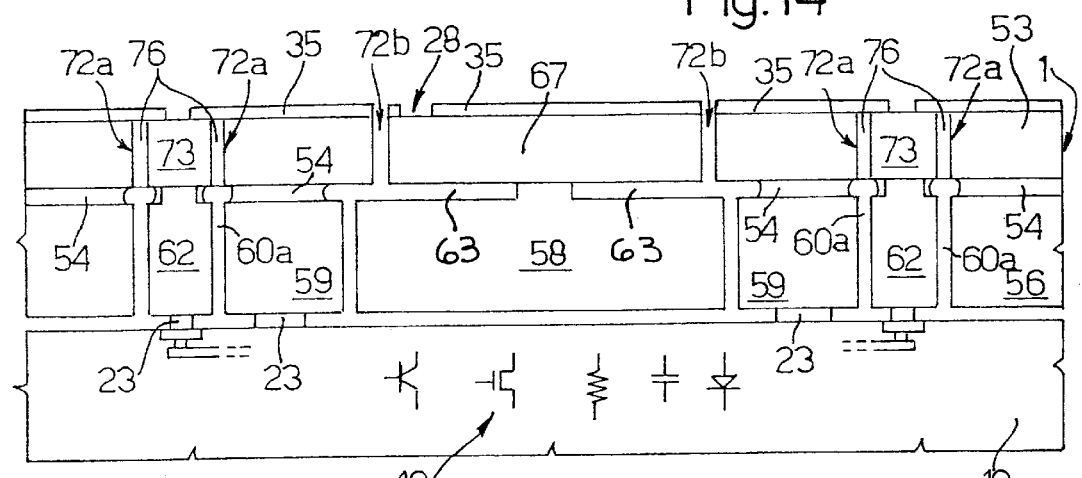
FIG. 15 shows a cross-section of the wafer of FIG. 14 after bonding to a second semiconductor material wafer.

Subsequently, as illustrated in FIG. 15, the first wafer 1 is turned upside down and bonded to the second wafer 10, inside which components of the circuit 40 have already been formed, and on top of which the connection regions 23 have already been made. Also in this case, a low-temperature heat treatment is carried out to enable a chemical reaction between the silicon of the epitaxial layer 56, at the second plug portions 62, and the metal of the connection regions 23. Next, the substrate 53 of the first wafer 1 is thinned until the insulating material 76, or at least the bottom of the first trenches 72a, is reached, an oxide layer 35 is deposited, the openings 28 are formed in the oxide layer 35, and then second trenches 72b are made which separate fixed parts from mobile parts in the substrate 53.

Figure 16:
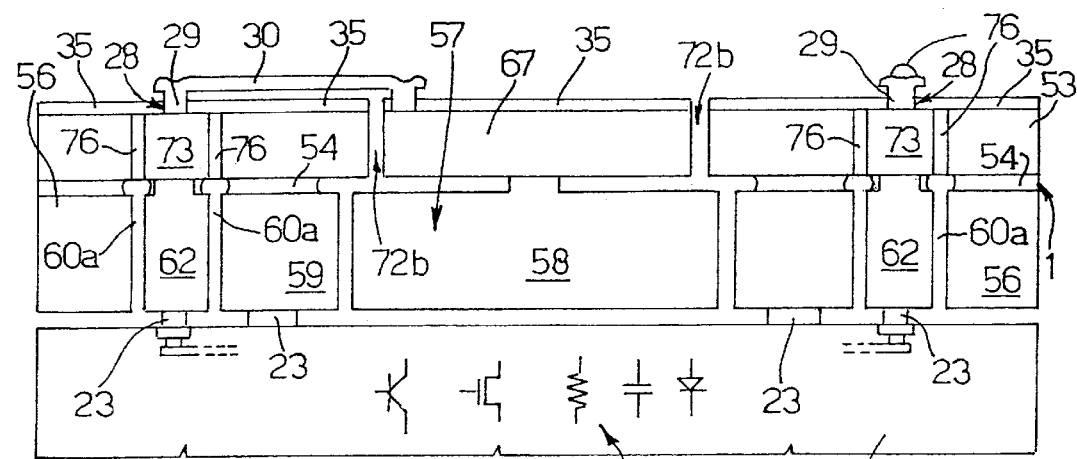
FIG. 16 shows a cross-section of a composite structure obtained from the double wafer of FIG. 15, in a subsequent manufacture step.

Next, as has been described with reference to FIG. 10, an insulating layer, for example stick foil, is deposited and selectively removed, and the electrical contacts 29 and electric connection lines 30 are formed. In FIG. 16, an electric connection line 30 connects the portion of the substrate 53 to which the rotor 58 is anchored, for example at cap region 67, to the first plug region 73 that is furthest to the left, thus enabling electrical connection of the rotor 58 to the circuit 40 through the cap region 67, the first plug portion 73 on the left, and the second plug portion 62 on the left. Shown in the right-hand half of FIG. 16 is instead the electrical connection between the circuit 40 and the outside, through the second plug portion 62, the first plug region 73, and the connection region 23 on the right.

Subsequently, the insulating layer is removed, and a body to be moved, for example a slider similar to the slider 41 of FIG. 11, can be fixed to the cap region 67.

The solution shown in FIGS. 13–16 thus provides a micromechanical structure 57 protected by a cap, for example cap region 67, and easily connects the circuit 40 both to the micromechanical structure 57 and to the outside.

Figure 7:
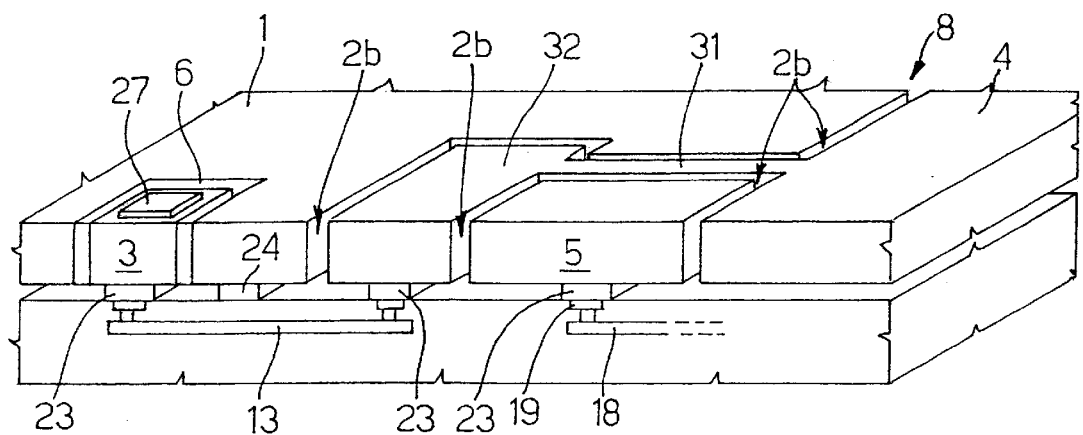
FIG. 7 is a perspective view of the left-hand half of the multiwafer structure of FIG. 6.
Figure 17:
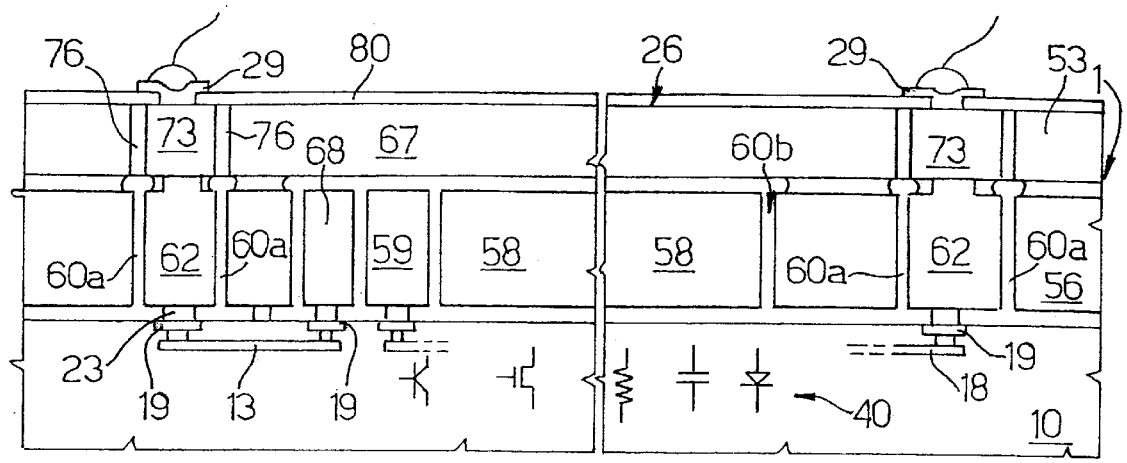
FIG. 17 shows a cross-section of a composite wafer, according to a fifth embodiment of the invention.

FIG. 17 shows a variation of the structure of FIG. 16, in which the rotor 58 is not anchored to the substrate 53, but is supported by springs (not shown) and biasing regions 60, similar to the biasing regions 31, 32 of FIG. 7. In addition, the cap region 67 is fixed and does not have the second trenches 72b. The rotor 58 and stator 59 are connected via connection regions 23 and pad regions 19 to metallic regions 13, 18 formed in the second wafer 10. The metallic regions 13 are connected to the outside, as shown in the left-hand half of FIG. 17, via further connection regions 23 aligned with plug regions 62, 73 formed in the first wafer 1, in a way similar to that described with reference to FIGS. 13–16, and via contacts 29. In addition, the metallic regions 18 enable connection of the circuit 40 to the stator 59 and, via plug regions 62, 73 and contacts 29, to the outside, as shown in the right-hand half of FIG. 17. An insulating layer 80 covers the surface 26 of the first wafer 1.

Figure 18:
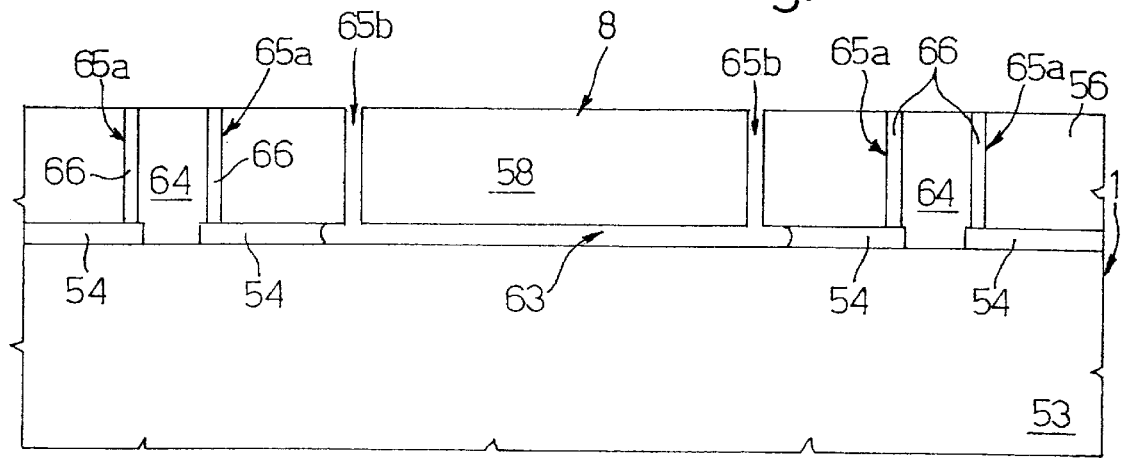
FIGS. 18 and 19 show cross-sections of a composite wafer, according to a sixth embodiment of the invention, in two successive manufacture steps.
Figure 19:
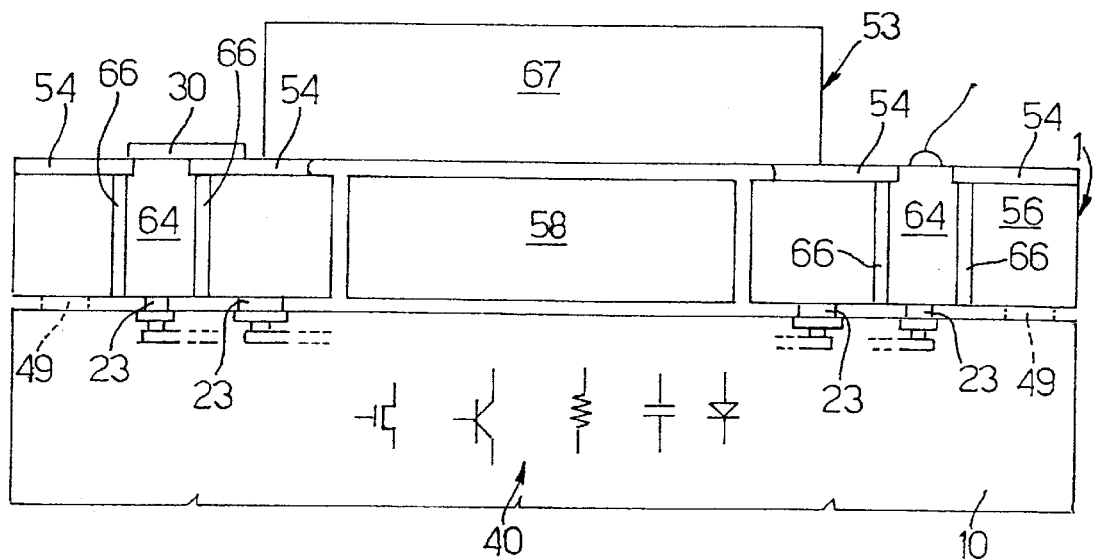

FIGS. 18 and 19 show a sixth embodiment, in which a micromechanical structure, for example an acceleration sensor 8, is protected by a cap and electrically connected to the biasing and sensing circuit via plug regions.

Initially, as illustrated in FIG. 18, the first wafer comprises a substrate 53, which, in contrast to the previous embodiments, is not etched to form trenches. On the substrate 53, a sacrificial layer 54 is deposited and defined, and is removed only at openings 55. Next, a polycrystalline silicon seed layer is deposited, and the epitaxial layer 56 is grown, as described with reference to FIG. 14.

The epitaxial layer 56 is etched to form fifth trenches 65a for delimiting second plug portions 64. Here, the fifth trenches 65a are filled, either partially or completely, with insulating material 66, sixth trenches 65b are formed for defining the accelerometric sensor 8, and the sacrificial layer 54 is partially removed through the sixth trenches 65b, so as to free the rotor 58 of the acceleration sensor 8. As for the embodiment shown in FIGS. 1–8, the rotor 58 is carried by the fixed part via springs (not illustrated).

Subsequently, the first wafer 1 is bonded to the second wafer 10 using the connection regions 23 already formed on the surface 22 of the second wafer 10. Then the first wafer 1 is thinned by grinding until the desired thickness for the substrate 53. Next, the substrate 53 is selectively removed so as to form a cap region 67 of larger dimensions than the rotor 58, but of smaller dimensions than the chip housing the circuit 40, obtained after cutting the wafers 1, 10. In this way, the cap region 67 covers the rotor 58 from the back, protecting it mechanically, but leaves the plug regions 64 free.

Finally, the contacts 29 and the electric connection lines 30 are formed, which, in this embodiment, contact directly the silicon of the epitaxial layer 54. In particular, in the example illustrated in FIG. 19, an electric connection line 30 connects a region (not shown), arranged inside the fixed part and is electrically connected to the rotor 58, to the plug region 64 on the left, and thus to the circuit 40. A ball-and-wire connection on the right instead enables connection of the circuit 40 to the outside.

When the acceleration sensor 8 is to be kept at low pressure, for example to reduce friction with air during movement, a sealing region 49 may be provided which surrounds the area of the acceleration sensor 8, then the first wafer 1 may be bonded to the second wafer 10 in vacuum conditions, as already described with reference to FIG. 12.

The advantages of the process and structures described are evident from the above. In particular, they enable mechanical connection of two bodies of semiconductor material, in particular of monocrystalline silicon, arranged on one another, and at the same time the electrical connection of a structure or circuit formed in the underlying body, which is covered by the overlying body, to the outside or to a structure made in the overlying body; or else, they enable electrical connection of the underlying body to regions arranged above the overlying body, without requiring complicated and costly processes to be carried out from the back, without damaging the structures and circuits already made, and applying single manufacture steps that are commonly used in the manufacture of wafers of semiconductor material for forming micro-electromechanical structures.

The described solutions moreover make it possible, when necessary, to isolate preset areas of the underlying body and/or of the overlying body from the outside environment, for example to enclose delicate elements in a low-pressure environment, and/or to isolate and prevent contamination of these elements during manufacture, for example cutting semiconductor material wafers, during subsequent manipulation steps, and during use.

Finally, it is clear that numerous modifications and variations may be made to the connection structure, the composite structure, and to the manufacture process described and illustrated herein, all falling within the scope of the invention, as defined in the attached claims. In particular, the present connection structure may be used for a wide range of applications, both for the connection of electronic circuits integrated in two or more different substrates, and for the connection of micro-electromechanical structures of various kinds to biasing/control/sensing circuits associated to the micro-electromechanical structures. The present connection structure may be used for connecting a high number of substrates, according to the requirements and to general considerations of a mechanical/electrical nature.

What is claimed is:

1. An electric connecting structure for connecting a first body of semiconductor material overlaid by a second body of semiconductor material, the connecting structure comprising:
    a plug region extending through a portion of said second body and made of monocrystalline semiconductor material;
    an insulation region surrounding laterally said plug region; and
    a first electromechanical connection region of electrically conductive material arranged between said first body and said second body and in electrical contact with said plug region and with conductive regions of said first body.

2. The electric connection structure of claim 1, wherein said plug region extends throughout a thickness of said second body and has a first face and a second face, said first face being in contact with said first electromechanical connection region; and
    further comprising a contact region of electrically conducting material in contact with said second face of said plug region.

3. The electric connection structure of claim 2, further comprising an electric connection line extending above said second body and having a first end forming said contact region.

4. The electric connection structure of claim 3, wherein said electric connection line has a second end in electrical contact with a conductive region of said second body.

5. The electric connection structure of claim 3, wherein said electric connection line has a second end in electrical contact with a contact region formed on a third body fixed to said second body.

6. The electric connection structure of claim 2, for electrically connecting said second body to a third body of semiconductor material arranged on said second body, wherein said contact region further comprises at least one second electromechanical connection region made of a material resulting from the chemical reaction of said semiconductor material with a metal, said second electromechanical connection regions being arranged between said second body and said third body.

7. The electric connection structure according to claim 1, wherein said insulation region comprises a trench having a closed shape filled at least partially with insulating material.

8. The electric connection structure according to claim 1, wherein said first electromechanical connection region is made of a material resulting from the chemical reaction of said semiconductor material with a metal.

9. The electric connection structure according to claim 1, wherein said first electromechanical connection region is made of a metal resulting from the chemical reaction of silicon with a metal chosen from among a group comprising gold, palladium, titanium, and nickel.

10. The electric connection structure of claim 1 wherein said plug region and said second body are made of the same material.

11. An electric connecting structure for connecting a first body of semiconductor material overlaid by a second body of semiconductor material comprising a substrate region and an epitaxial region arranged on each other and partially insulated from one another by insulating regions, the connecting structure comprising:
    a plug region extending through a portion of said second body and made of semiconductor material;

an insulation region surrounding laterally said plug region; and a first electromechanical connection region of electrically conductive material arranged between said first body and said second body and in electrical contact with said plug region and with conductive regions of said first body, wherein:

said plug region further comprises a first plug portion extending throughout the thickness of said substrate region, and a second plug portion formed inside said epitaxial region, said second plug portion being aligned and in direct electrical contact with said first plug portion;

said insulation region further comprises a first insulation portion laterally surrounding said first plug portion, and a second insulation portion laterally surrounding said second plug portion;

a contact region of electrically conducting material extends on a free face of said substrate region in electrical contact with said first plug portion; and said second plug portion faces and is in direct electrical contact with said first electromechanical connection region.

12. The electric connection structure of claim 11 wherein said plug region and said second body are formed from a common material.

13. The electric connection structure of claim 11 wherein said plug region is made of monocrystalline semiconductor material.

14. An electric connecting structure for connecting a first body of semiconductor material overlaid by a second body of semiconductor material comprising a substrate region and an epitaxial region arranged on one another and reciprocally insulated by insulating regions, the connection structure comprising:

a plug region extending through a portion of said second body and made of semiconductor material;

an insulation region surrounding laterally said plug region; and a first electromechanical connection region of electrically conductive material arranged between said first body and said second body and in electrical contact with said plug region and with conductive regions of said first body, wherein said substrate region has a smaller area than said epitaxial region, said plug region extends throughout the thickness of said epitaxial region, and has a first face and a second face, said first face being in contact with said first electromechanical connection region, and said second face being in direct contact with at least one electric connection region of electrically conducting material.

15. The electric connection structure of claim 14 wherein said plug region and said second body are both formed from a common material.

16. The electric connection structure of claim 14 wherein said plug region is made of monocrystalline semiconductor material.

17. A composite structure comprising:

a first body of semiconductor material;

a second body of semiconductor material arranged on said first body); and an electric connection structure, including:

a plug region extending through a portion of said second body and made of monocrystalline semiconductor material, an insulation region laterally surrounding said plug region, and a first electromechanical connection region of electrically conductive material arranged between said first body and said second body and in electrical contact with said plug region and with conductive regions of said first body.

18. The composite structure according to claim 17, wherein said plug region extends throughout the thickness of said second body and has a first face and a second face, said first face being in contact with said first electromechanical connection region;

further comprising a contact region of electrically conducting material, in contact with said second face of said plug region; and wherein said first body houses an electronic circuit); and said second body houses a micro-electromechanical device comprising a fixed part and a mobile part separated from each other by at least one delimitation trench extending through said second body.

19. The composite structure of claim 18, further comprising an external electric connection wire bonded to said contact region.

20. The composite structure of claim 18, wherein said electric connection structure further comprises an electric connection line extending above said second body and having a first end forming said contact region, and a second end in electrical contact with said micro-electromechanical device.

21. The composite structure of claim 18, further comprising a third body fixed to said second body, said electric connection structure further comprising an electric connection line having a first end forming said contact region and a second end in electrical contact with a contact region formed on said third body.

22. The composite structure of claim 21, wherein said third body is a slider, and said composite structure forms an actuator unit for micrometric position regulation of a hard-disk driver.

23. The composite structure of claim 17, wherein the first body of semiconductor material further houses a first electronic circuit;

further comprising a third body of semiconductor material and housing a second electronic circuit, said third body fixed to said second body; and the electric connection structure, wherein:

said plug region includes a first face and a second face, said plug region connecting together said first and second electronic circuits, said first electromechanical connection region arranged between said first body and said second body is further in electrical contact with said first face of said plug region, and further comprising a contact region of electrically conducting material in contact with said second face of said plug region, the contact region having at least one second electromechanical connection region made of a material resulting from the chemical reaction of said semiconductor material with a metal, said second electromechanical connection regions being arranged between said second body and said third body.

24. The composite structure of claim 23, further comprising a sealing region having a closed shape and arranged between said first and said second bodies, outside one of said first and second electronic circuits.

25. A composite structure comprising:

a first body of semiconductor material;

a second body of semiconductor material arranged on said first body and comprising a an epitaxial region housing a micro-electromechanical device having a fixed part and a mobile part separated from one another by a delimitation trench extending through said epitaxial region and a substrate region forming a cap region and arranged over the mobile part of said epitaxial region, said epitaxial region and said substrate region being arranged on each other and partially insulated from one another by first and second insulating regions; and an electric connection structure, including:
- a first plug portion formed of semiconductor material and extending throughout the thickness of said substrate region,
- a second plug portion formed of semiconductor material and formed inside said epitaxial region, said second plug portion being aligned and in direct electrical contact with said first plug portion and further facing and in direct electrical contact with a first electromechanical connection region,
- said first electromechanical connection region being formed of electrically conductive material arranged between said first body and said second body and in electrical contact with conductive regions of said first body,
- said first insulation portion laterally surrounding said first plug portion, and
- said second insulation portion laterally surrounding said second plug portion; and
- a contact region of electrically conducting material extending on a free face of said substrate region in electrical contact with said first plug portion.

26. A composite structure comprising:

a first body of semiconductor material;

a second body of semiconductor material arranged on said first body and comprising an epitaxial region housing a micro-electromechanical device comprising a fixed part and a mobile part separated from one another by at least one delimitation trench extending through said epitaxial region and a substrate region forming a cap region which has larger dimensions than said mobile part and is fixed to said fixed part, said epitaxial region and said substrate region overlaid to each other and reciprocally insulated from one another by insulating regions; and an electric connection structure, including:
- a plug region extending throughout the thickness of said epitaxial region of said second body and made of semiconductor material, said plug region having a first face and a second face, said first face being in contact with a first electromechanical connection region, and said second face being in direct contact with at least one electric connection region of electrically conducting material,
- said first electromechanical connection region of electrically conductive material arranged between said first body and said second body and in electrical contact with said plug region and with conductive regions of said first body, and
- an insulation region laterally surrounding said plug region.

* * * * *

UNITED STATES PATENT AND TRADEMARK OFFICE
CERTIFICATE OF CORRECTION

| | | |
|---|---|---|
| PATENT NO. | : 6,504,253 B2 | |
| APPLICATION NO. | : 09/844180 | |
| DATED | : January 7, 2003 | |
| INVENTOR(S) | : Ubaldo Mastromatteo et al, | |

It is certified that error appears in the above-identified patent and that said Letters Patent is hereby corrected as shown below:

Column 9, Line 63:
"first body); and" should read, --first body; and--

Column 10, Line 16:
"wherein said first body houses an electronic circuit); and" should read, --wherein said first body houses an electronic circuit; and--.

Signed and Sealed this
Twenty-first Day of February, 2012

David J. Kappos
*Director of the United States Patent and Trademark Office*

(12) EX PARTE REEXAMINATION CERTIFICATE (10766th)
United States Patent
Mastromatteo et al.

(10) Number: US 6,504,253 C1
(45) Certificate Issued: Nov. 24, 2015

(54) STRUCTURE FOR ELECTRICALLY CONNECTING A FIRST BODY OF SEMICONDUCTOR MATERIAL OVERLAID BY A SECOND BODY OF SEMICONDUCTOR MATERIAL COMPOSITE STRUCTURE USING ELECTRIC CONNECTION STRUCTURE

(75) Inventors: Ubaldo Mastromatteo, Bareggio (IT); Fabrizio Ghironi, Bareggio (IT); Roberto Aina, Bareggio (IT); Mauro Bombonati, Abbiategrasso (IT)

(73) Assignee: STMicroelectronics, Inc.

Reexamination Request:
No. 90/012,499, Sep. 11, 2012
No. 90/012,778, Jan. 30, 2013

Reexamination Certificate for:
Patent No.: 6,504,253
Issued: Jan. 7, 2003
Appl. No.: 09/844,180
Filed: Apr. 27, 2001

Certificate of Correction issued Feb. 21, 2012

(30) Foreign Application Priority Data

Apr. 28, 2000 (EP) .................................. 00830314

(51) Int. Cl.
*H01L 23/48* (2006.01)
*H01L 23/52* (2006.01)
*H01L 29/40* (2006.01)
*H01L 23/532* (2006.01)
*H01L 21/768* (2006.01)

(52) U.S. Cl.
CPC ....... *H01L 23/5329* (2013.01); *H01L 21/76807* (2013.01)

(58) Field of Classification Search
None
See application file for complete search history.

(56) References Cited

To view the complete listing of prior art documents cited during the proceedings for Reexamination Control Numbers 90/012,499 and 90/012,778, please refer to the USPTO's public Patent Application Information Retrieval (PAIR) system under the Display References tab.

*Primary Examiner* — Tuan H Nguyen

(57) ABSTRACT

An electric connection structure connecting a first silicon body to conductive regions provided on the surface of a second silicon body arranged on the first body. The electric connection structure includes at least one plug region of silicon, which extends through the second body; at least one insulation region laterally surrounding the plug region; and at least one conductive electromechanical connection region arranged between the first body and the second body, and in electrical contact with the plug region and with conductive regions of the first body. To form the plug region, trenches are dug in a first wafer and are filled, at least partially, with insulating material. The plug region is fixed to a metal region provided on a second wafer, by performing a low-temperature heat treatment which causes a chemical reaction between the metal and the silicon. The first wafer is thinned until the trenches and electrical connections are formed on the free face of the first wafer.

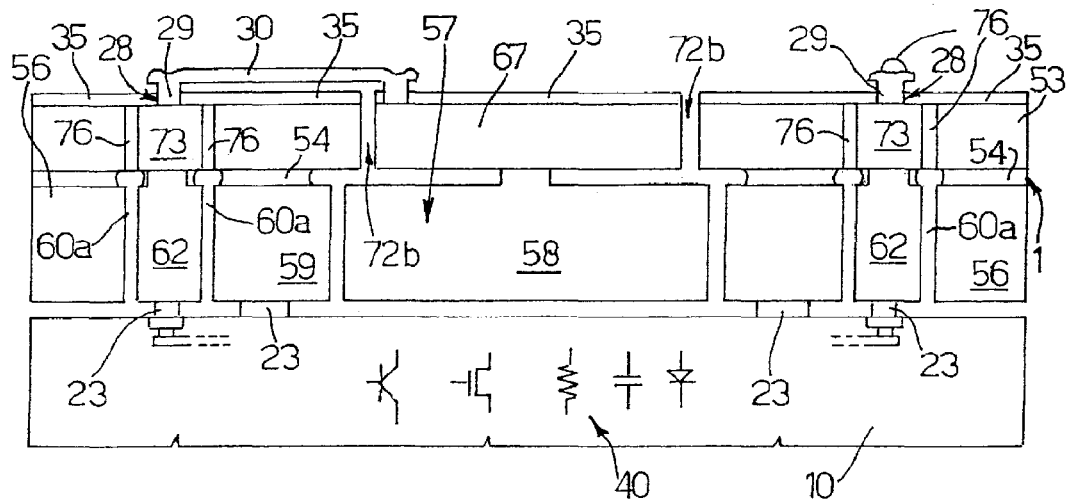

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-10, 17 and 23-24 is confirmed.

New claims 27-42 are added and determined to be patentable.

Claims 11-16, 18-22, 25 and 26 were not reexamined.

27. *The electric connection structure of claim 1, wherein said first body is a first wafer and said second body is a second wafer.*

28. *The electric connection structure of claim 27, wherein said first wafer and said second wafer are made of monocrystalline semiconductor material.*

29. *The electric connection structure of claim 1, wherein said insulation region is formed in a trench etched into said second body.*

30. *The electric connection structure of claim 1, wherein said first body and said second body are both made primarily of monocrystalline semiconductor material.*

31. *The electric connection structure of claim 1, wherein said insulation region has a width that is approximately equal to or smaller than the width of said plug region.*

32. *The electric connection structure of claim 1 further comprising a plurality of plug regions extending through a portion of said second body and made of monocrystalline semiconductor material and a plurality of insulation regions, wherein each insulation region surrounds laterally one of said plurality of plug regions.*

33. *The composite structure of claim 17, wherein said first body is a first wafer and said second body is a second wafer.*

34. *The composite structure of claim 33, wherein said first wafer and said second wafer are made of monocrystalline semiconductor material.*

35. *The composite structure of claim 17, wherein said insulation region is formed in a trench etched into said second body.*

36. *The composite structure of claim 17, wherein said first body and said second body are both made primarily of monocrystalline semiconductor material.*

37. *The composite structure of claim 17, wherein said insulation region has a width that is approximately equal to or smaller than the width of said plug region.*

38. *The composite structure of claim 17, wherein said electric connection structure further includes a plurality of plug regions extending through a portion of said second body and made of monocrystalline semiconductor material and a plurality of insulation regions, wherein each insulation region surrounds laterally one of said plurality of plug regions.*

39. *A composite structure comprising:*
 *a first body of semiconductor material;*
 *a second body of semiconductor material arranged on said first body; and*
 *an electric connection structure, including:*
  *a plug region extending through a portion of said second body and made of monocrystalline semiconductor material,*
  *an insulation region laterally surrounding said plug region, and*
  *a first electromechanical connection region of electrically conductive material arranged between said first body and said second body and in electrical contact with said plug region and with conductive regions of said first body;*
 *wherein said plug region and said second body are made of the same material.*

40. *The composite structure of claim 39, wherein said first body and said second body are both made primarily of monocrystalline semiconductor material.*

41. *The composite structure of claim 39, wherein said insulation region has a width that is approximately equal to or smaller than the width of said plug region.*

42. *The composite structure of claim 39, wherein said electric connection structure further includes a plurality of plug regions extending through a portion of said second body and made of monocrystalline semiconductor material and a plurality of insulation regions, wherein each insulation region surrounds laterally one of said plurality of plug regions.*

* * * * *